(12) United States Patent
Lee et al.

(10) Patent No.: US 9,406,584 B2
(45) Date of Patent: Aug. 2, 2016

(54) SEMICONDUCTOR PACKAGE AND METHOD FOR MANUFACTURING THE SAME

(71) Applicant: SK hynix Inc., Icheon-si Gyeonggi-do (KR)

(72) Inventors: Jeong Hwan Lee, Seoul (KR); Tac Keun Oh, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 46 days.

(21) Appl. No.: 14/461,840

(22) Filed: Aug. 18, 2014

(65) Prior Publication Data

US 2015/0311182 A1  Oct. 29, 2015

(30) Foreign Application Priority Data

Apr. 24, 2014 (KR) .................. 10-2014-0049556

(51) Int. Cl.
| | |
|---|---|
| *H01L 23/02* | (2006.01) |
| *H01L 23/373* | (2006.01) |
| *H01L 23/31* | (2006.01) |
| *H01L 23/00* | (2006.01) |
| *H01L 25/18* | (2006.01) |
| *H01L 23/24* | (2006.01) |

(52) U.S. Cl.
CPC ........ *H01L 23/3737* (2013.01); *H01L 23/3128* (2013.01); *H01L 23/3135* (2013.01); *H01L 23/562* (2013.01); *H01L 25/18* (2013.01); *H01L 23/24* (2013.01); *H01L 2224/16225* (2013.01); *H01L 2924/14* (2013.01); *H01L 2924/1431* (2013.01); *H01L 2924/1434* (2013.01); *H01L 2924/157* (2013.01); *H01L 2924/15159* (2013.01); *H01L 2924/15311* (2013.01); *H01L 2924/1815* (2013.01); *H01L 2924/18161* (2013.01); *H01L 2924/3511* (2013.01)

(58) Field of Classification Search
CPC ..................... H01L 2924/181; H01L 2224/97; H01L 24/97; H01L 23/49827; H01L 2924/3511
USPC .................................. 257/787, 790, 723, 724
See application file for complete search history.

(56) References Cited

U.S. PATENT DOCUMENTS

| | | | | |
|---|---|---|---|---|
| 7,145,228 B2* | 12/2006 | Yean | ................... | H01L 23/5389 257/698 |
| 7,863,755 B2* | 1/2011 | Lee | ................ | H01L 21/561 257/686 |
| 7,911,044 B2* | 3/2011 | Yang | .................... | H01L 23/467 257/685 |
| 8,476,120 B2* | 7/2013 | Huang | .................... | H01L 23/50 257/532 |
| 8,658,464 B2* | 2/2014 | Cheng | .................... | B29C 39/10 257/778 |
| 8,759,953 B2* | 6/2014 | Yamamoto | .......... | H01L 23/3121 257/659 |
| 8,810,011 B2* | 8/2014 | Pagaila | ................. | H01L 23/147 257/660 |
| 2006/0006534 A1* | 1/2006 | Yean | ................... | H01L 23/5389 257/737 |

(Continued)

*Primary Examiner* — S. V. Clark
(74) *Attorney, Agent, or Firm* — William Park & Associates Ltd.

(57) ABSTRACT

A semiconductor package may include an interposer; a first semiconductor chip disposed on a first surface of the interposer and at least one second semiconductor chip disposed at a predefined distance from the first semiconductor chip, a molding part filling spaces between the first semiconductor chip and the at least one second semiconductor chip and having a trench hole formed therein, and a thermal expansion buffer pattern filling the trench hole.

17 Claims, 20 Drawing Sheets

(56) References Cited

U.S. PATENT DOCUMENTS

| | | | |
|---|---|---|---|
| 2008/0122025 A1* | 5/2008 | Roggenbauer | H01L 21/76264 257/501 |
| 2009/0152742 A1 | 6/2009 | Ikeguchi et al. | |
| 2012/0061857 A1 | 3/2012 | Ramadoss et al. | |
| 2015/0091157 A9* | 4/2015 | Chi | H01L 23/49827 257/737 |
| 2015/0270245 A1* | 9/2015 | Yamada | H01L 23/49816 257/724 |

\* cited by examiner

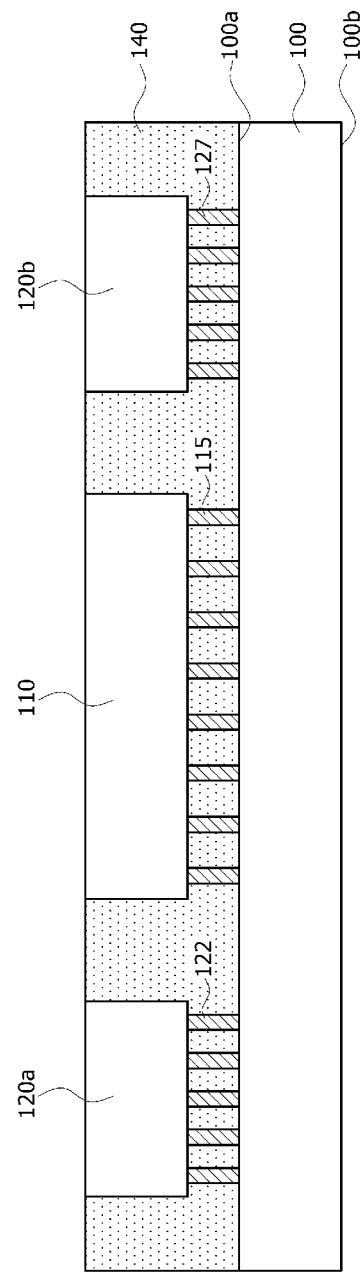

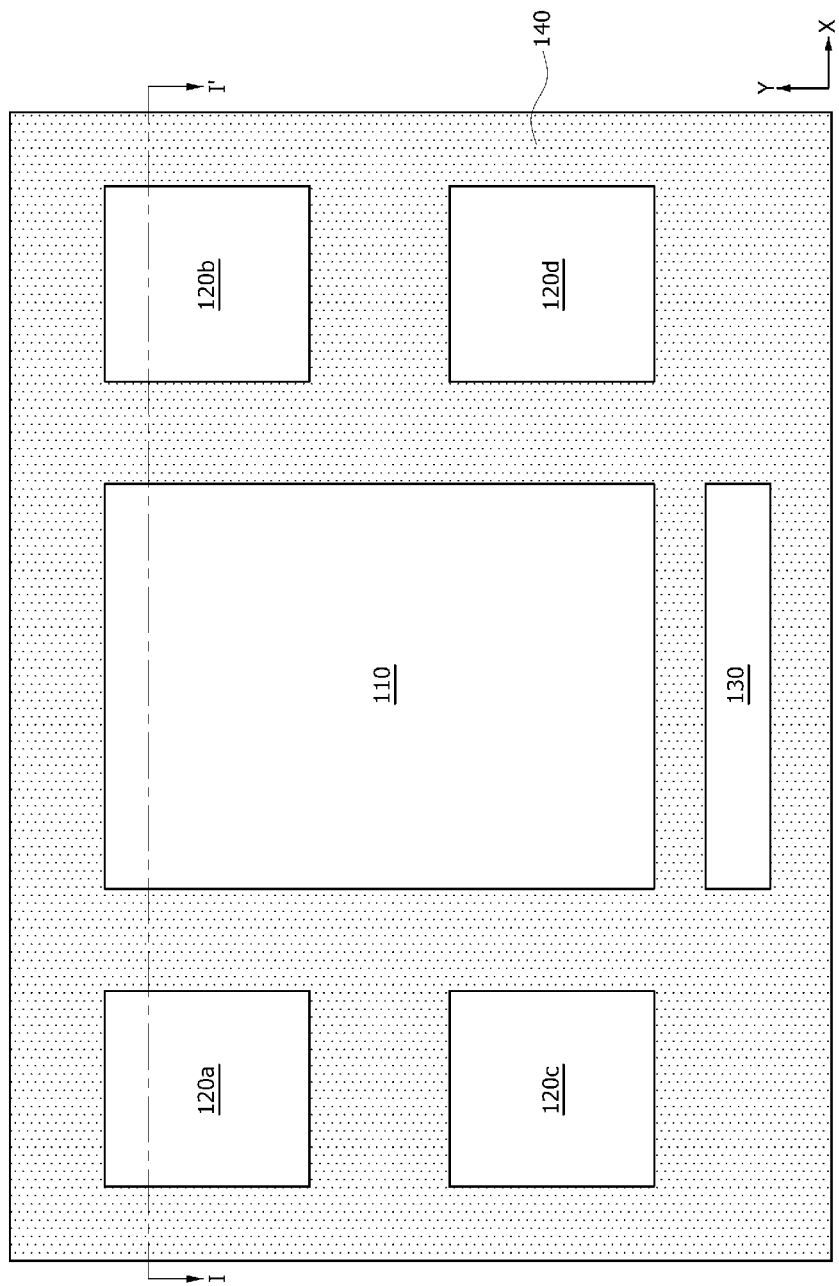

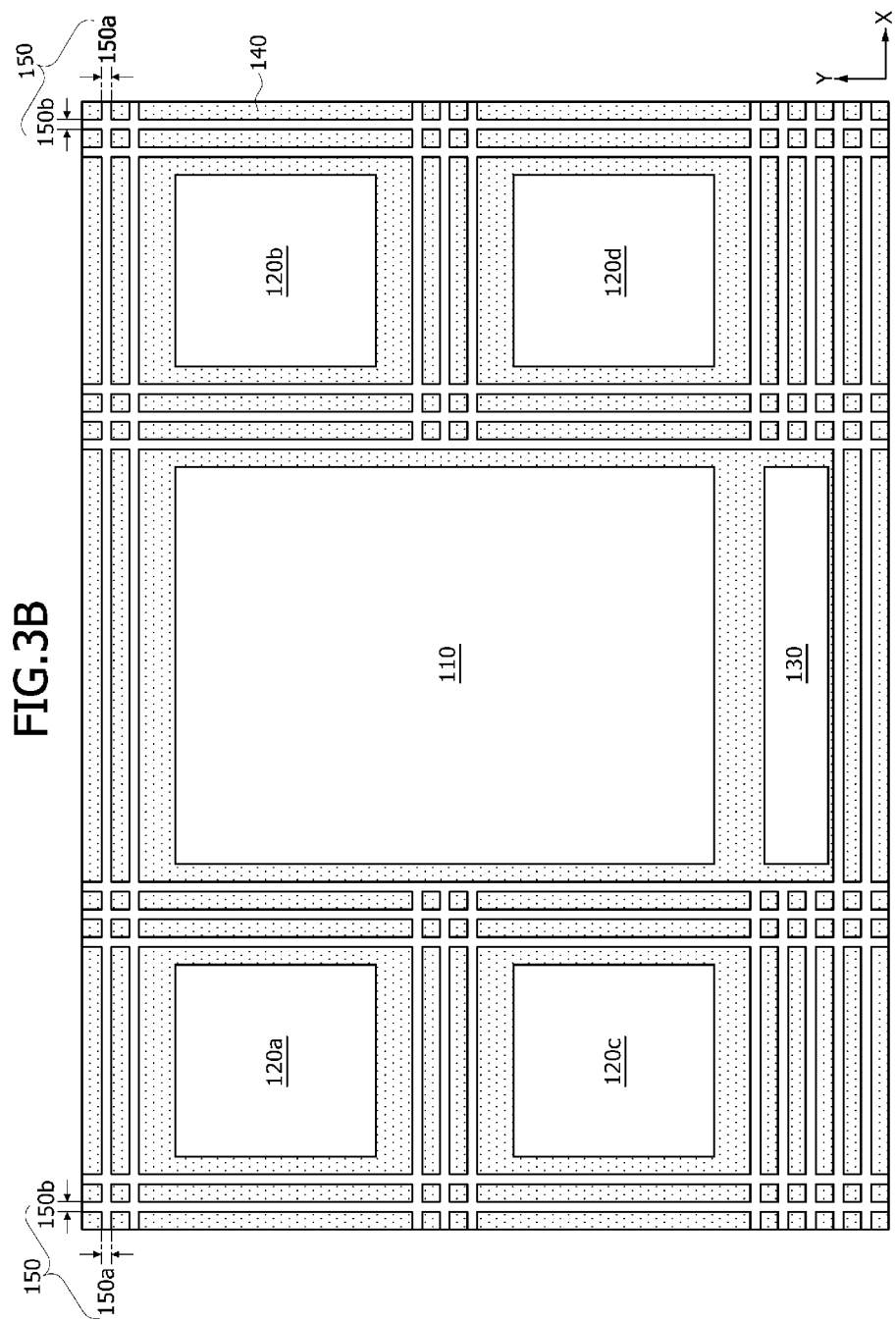

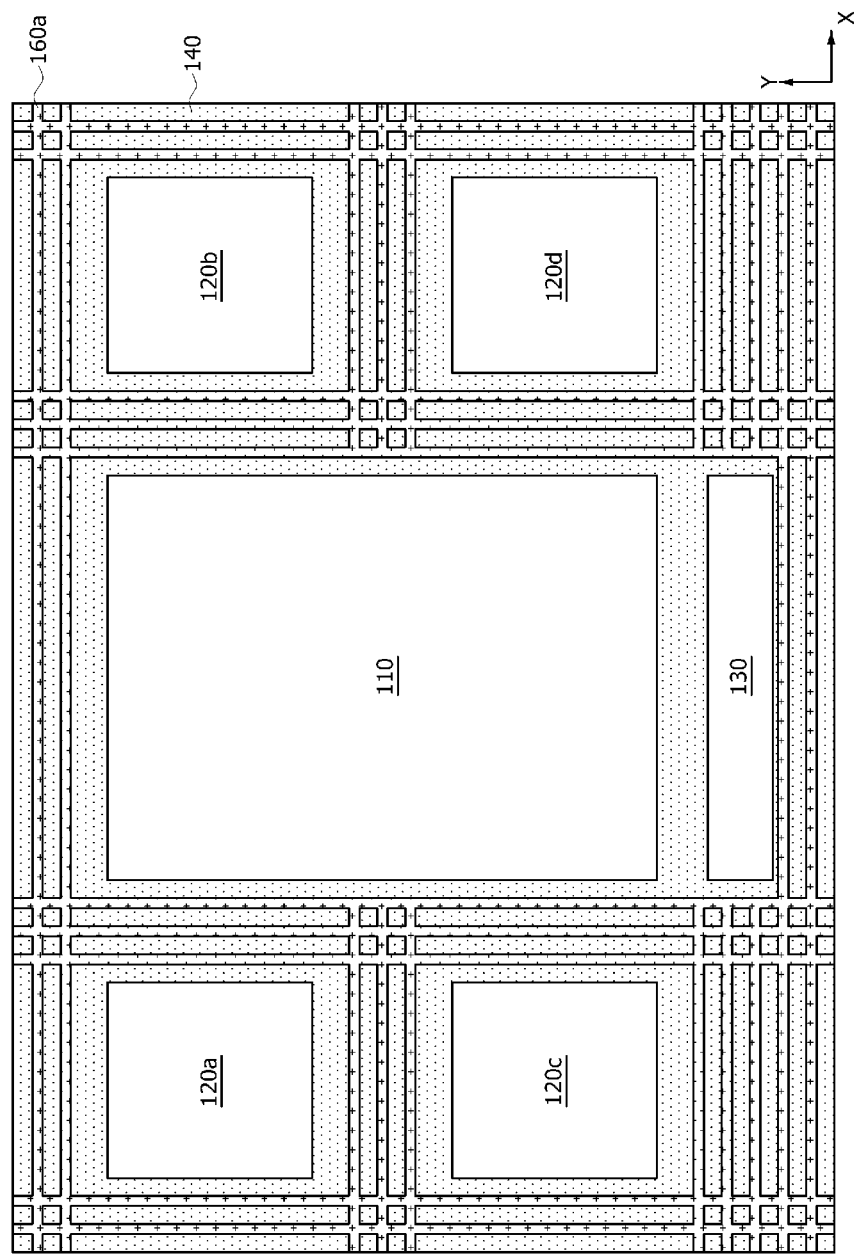

SEMICONDUCTOR PACKAGE AND METHOD FOR MANUFACTURING THE SAME

CROSS-REFERENCES TO RELATED APPLICATIONS

The present application claims priority to Korean Patent application number 10-2014-49556, filed on Apr. 24, 2014, which is incorporated by reference in its entirety as set forth in full.

BACKGROUND OF THE INVENTION

1. Technical Field

Embodiments relates to semiconductor devices, and more particularly, to a semiconductor package and a method for fabricating the same.

2. Related Art

Electronic devices have been decreasing in size and improving in performance. The demand for portable mobile products is on the rise. Thus, the demand for ultra-small and large-capacity semiconductor memories is also on the rise. In some instances, the storage capacity of semiconductor memory devices may be increased by mounting a plurality of semiconductor chips within a single semiconductor package followed by assembly of the semiconductor package. This involves altering the packaging method in order to increase the storage capacity of semiconductor memory devices.

One example of a mechanism for forming multi-chip packages may involve mounting a plurality of semiconductor chips in a horizontal direction and mounting a plurality of semiconductor chips in a vertical direction. In another example, a stack type multi-chip package may include a plurality of semiconductor chips stacked in a vertical direction. The stack type multi-chip package may allow for a relative increase in density within a limited space. Through-silicon vias (TSVs) may be used in a stack type multi-chip package. The TSVs are formed through a plurality of chips so as to physically and electrically couple the semiconductor chips.

As the use of semiconductor devices has expanded into mobile devices, a system in package (SIP) has been introduced. The SIP includes multiple different types of semiconductor devices that are vertically stacked and electrically coupled through TSVs to form a single package. Unlike many single-chip packages, in a SIP, a plurality of semiconductor chips are stacked in a vertical direction. The same type of semiconductor chips may be stacked to increase relative storage density, or different types of semiconductor chips may be arranged to manufacture a package having relatively complex functionalities.

SUMMARY OF THE INVENTION

In an embodiment, a semiconductor package may include an interposer, a first semiconductor chip disposed on a first surface of the interposer and at least one second semiconductor chip disposed at a predefined distance from the first semiconductor chip, a molding part filling spaces between the first semiconductor chip and the at least one second semiconductor chip and having a trench hole formed therein, and a thermal expansion buffer pattern filling the trench hole.

In an embodiment, a semiconductor package may include an interposer, a first semiconductor chip disposed on a first surface of the interposer and a plurality of second semiconductor chips disposed at a predefined distance from the first semiconductor chip a molding part filling spaces between the first semiconductor chip and the plurality of second semiconductor chips and having an outer portion positioned substantially in line with an outer portion of the interposer, and a plurality of trench holes formed in the molding part.

BRIEF DESCRIPTION OF THE DRAWINGS

FIG. 2A is a block diagram representation of a cross-sectional view of an embodiment of a molding part covering the plurality of semiconductor chips arranged on the interposer;

FIG. 2B is a block diagram representation of an embodiment of a molding part covering the plurality of semiconductor chips arranged on the interposer;

FIG. 3B is a block diagram representation of an embodiment of trenches formed in the molding part covering the plurality of semiconductor chips arranged on the interposer;

FIG. 5B is a block diagram representation of an embodiment of thermal expansion buffer patterns formed to fill the trench holes formed in the molding part;

DESCRIPTION OF SPECIFIC EMBODIMENTS

Figure 1A:
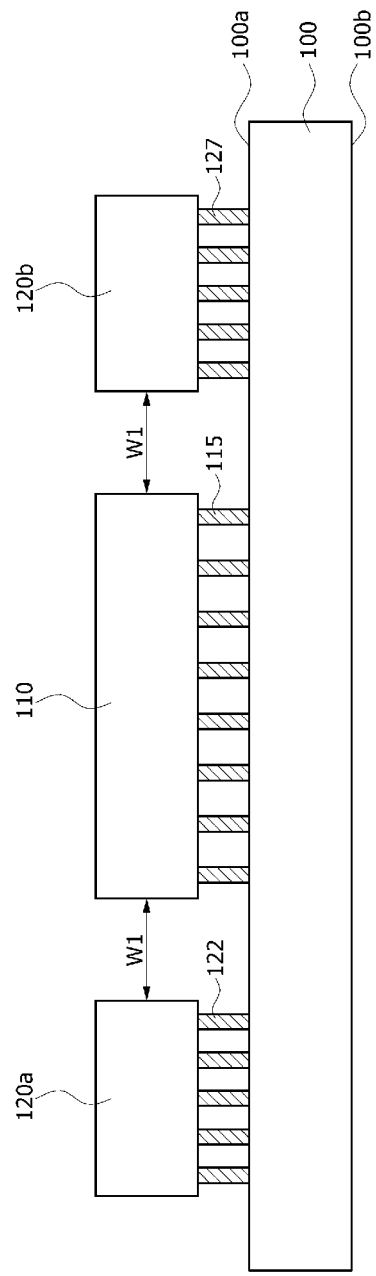
FIG. 1A is a block diagram representation of a cross-sectional view of an embodiment of an arrangement of a plurality of semiconductor chips on an interposer.
Figure 1B:
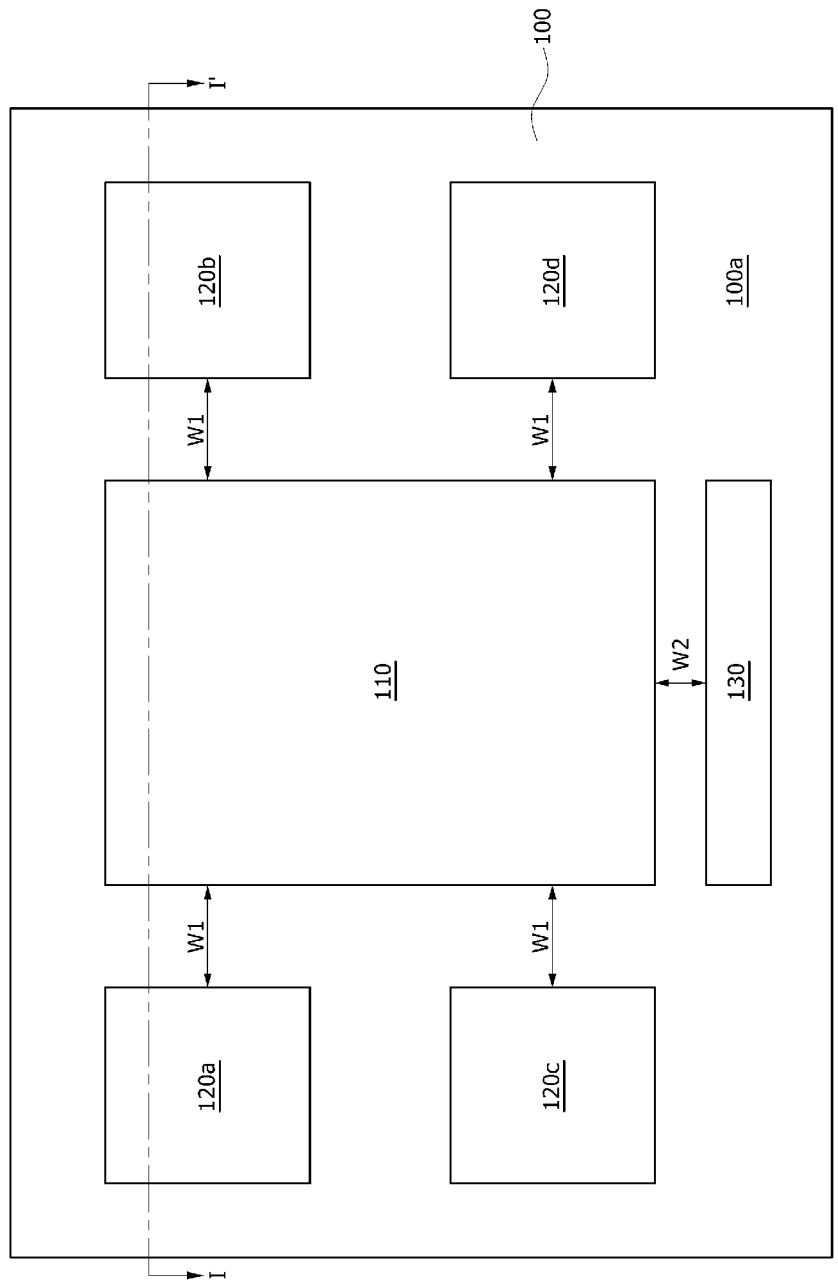
FIG. 1B is a block diagram representation of an embodiment of an arrangement of a plurality of semiconductor chips on an interposer.

Various embodiments will be described with reference to the accompanying drawings. It should be noted that the drawings are not to precise in scale and may be exaggerated in thickness of lines or sizes of components for convenience. Referring to FIGS. 1A and 1B, a plurality of semiconductor chips 110, 120a, 120b, 120c, 120d, 130 are arranged on an interposer 100. FIG. 1A is a cross-sectional view taken along line I-I' of FIG. 1B.

The interposer 100 may be formed of a semiconductor material including silicon (Si). The interposer 100 includes a first surface 100a and a second surface 100b on the opposite side of the first surface 100a. The plurality of semiconductor chips 110, 120a, 120b, 120c, 120d, 130 are arranged on the first surface 100a of the interposer 100.

A first semiconductor chip 110 and one or more second semiconductor chips 120a, 120b, 120c, 120d are mounted on the first surface 100a of the interposer 100. The first semiconductor chip 110 may be mounted as a single chip on the interposer 100 and disposed in approximately the center of the first surface 100a of the interposer 100. For example, the first semiconductor chip 110 may be implemented with a system integrated circuit (IC) including logic elements and the like. Each of the second semiconductor chips 120a, 120b, 120c, 120d may have a structure in which two or more semiconductor chips are stacked. An example of a second semiconductor chip is a memory semiconductor chip. The second semiconductor chips 120a, 120b, 120c, 120d may be arranged at a predefined first distance W1 from the first semiconductor chip 110.

FIG. 1B illustrates the configuration in which two second semiconductor chips are arranged on either side of the first semiconductor chip 110. Alternative embodiments may include different configurations of the second semiconductor chips with respect to the first semiconductor chip. A dummy chip 130 may be arranged at a second distance W2 from the first semiconductor chip 110 in an area that is not occupied by the second semiconductor chips.

The first semiconductor chip 110 may be electrically coupled to the interposer 100 through first connecting electrodes 115, and the second semiconductor chips 120a, 120b, 120c, 120d may be electrically coupled to the interposer 100 through second connecting electrodes 122, 127. The dummy chip 130 is not electrically coupled to the interposer 100.

Referring to FIGS. 2A and 2B, a molding part 140 is formed to cover the first semiconductor chip 110, the second semiconductor chips 120a, 120b, 120c, 120d, and the dummy chip 130. A molding material is applied onto the interposer 100. The molding material includes an insulating material, such as for example an epoxy molding compound (EMC). The molding material may be formed to cover the exposed portion of the interposer 100, the first semiconductor chip 110, the second semiconductor chips 120a, 120b, 120c, 120d, and the dummy chip 130 therein. The molding material may also fill the spaces between the adjacent first connecting electrodes 115 and the spaces between the second connecting electrodes 122, 127. An underfill material (not shown) may be used to fill the spaces between the first connecting electrodes 115 and the spaces between the second connecting electrodes 122, 127.

As the volume of the molding part 140 covering the interposer 100 increases, the expanding volume of the molding part 140 increases under the condition where the molding part 140 is reflowed. One or more dummy chips 130 may be arranged to substantially prevent the relative increase in the volume occupied by the molding part 140 over the interposer 100.

A polishing process or planarization process is performed on the molding material to form the molding part 140. The molding part 140 exposes an end of the first semiconductor chip 110, the second semiconductor chips 120a, 120b, 120c, 120d, and the dummy chip 130. In an embodiment, when the molding material is applied, a top surface of the first semiconductor chip 110, the second semiconductor chips 120a, 120b, 120c, 120d, and the dummy chip 130 may be directly exposed.

Figure 3A:
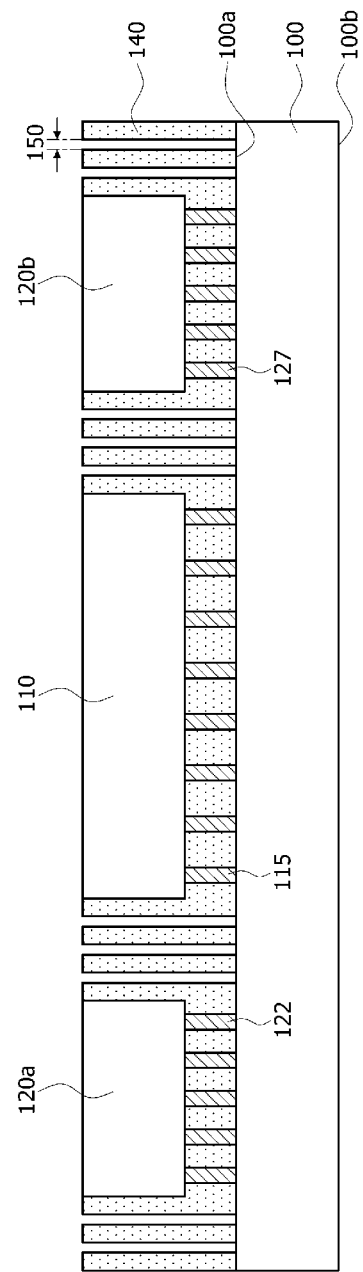
FIG. 3A is a block diagram representation of a cross-sectional view of an embodiment of trenches formed in the molding part covering the plurality of semiconductor chips arranged on the interposer.

Referring to FIGS. 3A and 3B, one or more trench holes 150 are formed in the molding part 140. The trench holes 150 may be formed at a predefined distance with respect to each other in the molding part 140. For example, the trench holes 150 may be formed in the molding part 140 between the first semiconductor chip 110 and the second semiconductor chips 120a, 120b, 120c, 120d and in the molding part 140 between the adjacent second semiconductor chips 120a, 120b, 120c, 120d. The trench holes 150 may be formed in the molding part 140 along the outer edges of the first semiconductor chip 110, the second semiconductor chips 120a, 120b, 120c, 120d, and the dummy chip 130.

The trench holes 150 may include a first trench hole 150a extending along an X direction of the interposer 100. The X direction of the interposer 100 is the horizontal direction along the first surface 100a of the interposer 100. A second trench hole 150b extends long a Y direction of the interposer 100. The Y direction of the interposer 100 is the vertical direction along the first surface 100a of the interposer 100. The first trench hole 150a and the second trench hole 150b may be arranged to cross each other. The trench holes 150 may be formed to surround the sides of the second semiconductor chips 120a, 120b, 120c, 120d. The trench holes 150 may be formed to surround the sides of the first semiconductor chip 110 and the dummy chip 130. The trench holes 150 may be formed through a sawing technique using laser or blade. The trench holes 150 may be formed by etching the molding part 140 until the surface of the interposer 100 is exposed. An outer portion of the molding part 140, where the trench holes 150 are formed may be positioned in line with an outer portion of the interposer 100.

Figure 4:
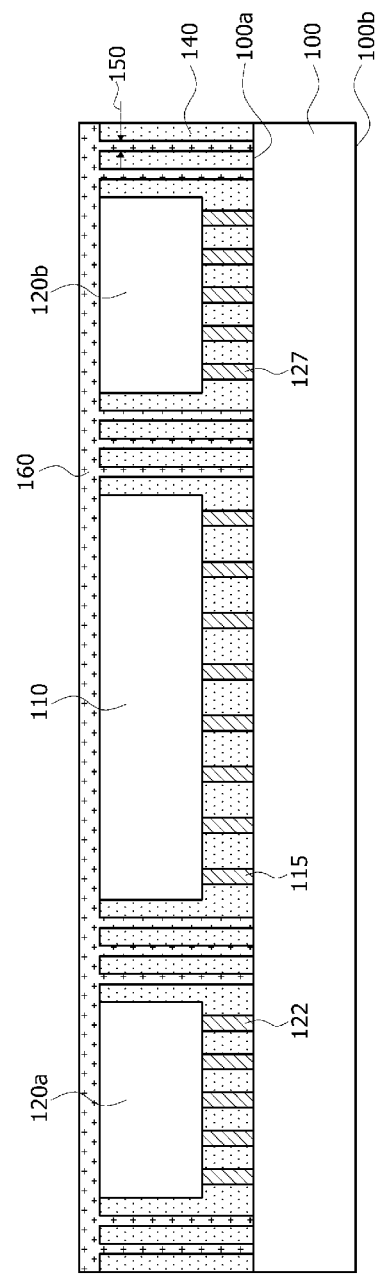
FIG. 4 is a block diagram representation of a cross-sectional view of an embodiment of a thermal expansion buffer layer formed to fill the trench holes formed in the molding part covering the plurality of semiconductor chips arranged on the interposer.

Referring to FIG. 4, a thermal expansion buffer layer 160 is formed to fill the trench holes 150 over the interposer 100. The thermal expansion buffer layer 160 may be formed by applying a liquid or gel-state material using a spin-coating method. The thermal expansion buffer layer 160 may be formed to a thickness to fill the trench holes 150 formed in the molding part 140 and cover the top surfaces of the first semiconductor chip 110, the second semiconductor chips 120a, 120b, 120c, 120d, and the dummy chip 130. The thermal expansion buffer layer 160 may be formed of a material having a relatively high coefficient of thermal expansion (CTE) or relatively high elastic modulus. In an embodiment, the thermal expansion layer 160 may be formed of one of an insulating polymer materials such as BCB (Benzocyclobutene) and polyimide or a mixture of one or more polymer materials.

Figure 5A:
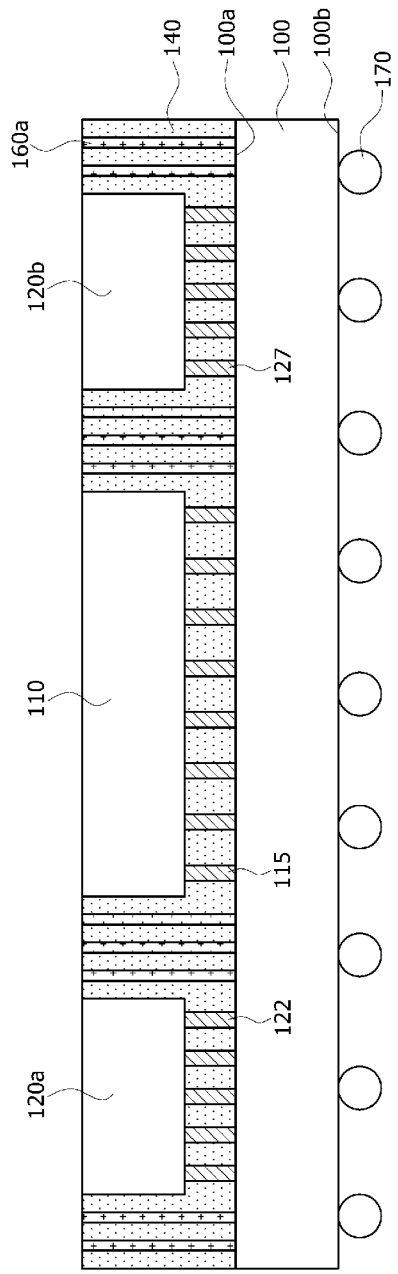
FIG. 5A is a block diagram representation of a cross-sectional view of an embodiment of thermal expansion buffer patterns formed to fill the trench holes formed in the molding part.

Referring to FIGS. 5A and 5B, a planarization process is performed on the thermal expansion buffer layer 160 to form thermal expansion buffer patterns 160a. The thermal expansion buffer patterns 160a may be formed, for example, through a chemical mechanical polishing (CMP) process. The planarization process may be performed until the upper surfaces of the first semiconductor chip 110, the second semiconductor chips 120a, 120b, 120c, 120d, and the dummy chip 130 are exposed. Then, the thermal expansion buffer patterns 160a are formed to fill the trench holes 150 formed in the molding part 140.

The molding part disposed between the semiconductor chips has a relatively higher coefficient of expansion than the interposer including silicon (Si). The molding part is relatively sensitive to thermal changes and tends to expand or contract in response to thermal changes. In semiconductor packages including the thermal expansion buffer patterns 160a formed in the molding part 140, the thermal expansion buffer patterns 160a reduce the occupied area of the molding part 140. The stress may be offset as the thermal expansion buffer patterns 160a arranged in the molding part 140 contract or expand when the temperature of the interposer 100 is changed. It may be possible to reduce a warpage associated with the bending of the interposer 100. The thermal expansion buffer patterns 160a arranged in the molding part 140 may become stress release points where stress applied to the molding part 140 is released. As the number of thermal expansion buffer patterns 160a arranged in the molding part 140 increases, additional stress may be released and the warpage may be reduced.

External connection terminals 170 may be formed on the second surface 100b of the interposer 100. Examples of external connection terminals 170 include, but are not limited to, solder balls, solder bumps or conductive bumps.

Figure 6A:
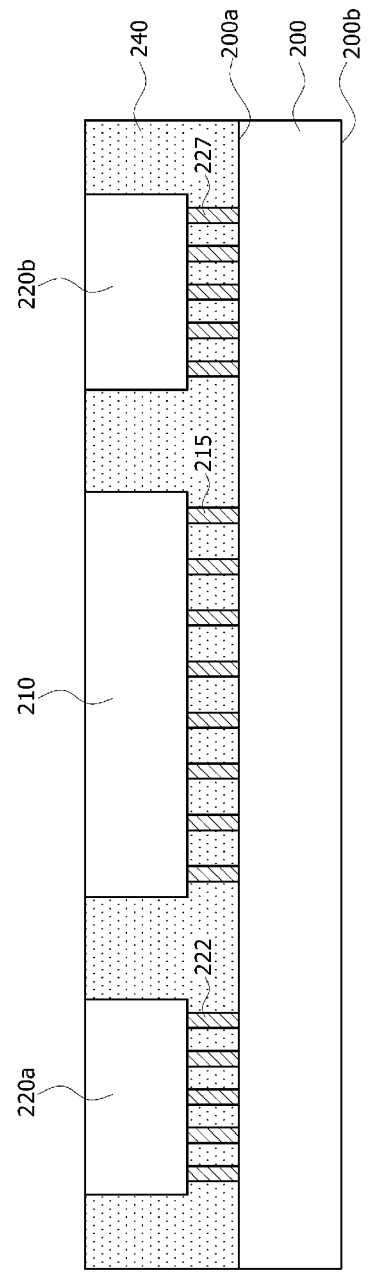
FIG. 6A is a block diagram representation of a cross-sectional view of an embodiment of a molding part covering a plurality of semiconductor chips arranged on the interposer.

An embodiment of a method for manufacturing a semiconductor package will be described with reference to FIGS. 6A to 9, and duplications of the above-described sections will be omitted or briefly described. FIG. 6A is a cross-sectional view taken along line II-II' of FIG. 6B.

Figure 6B:
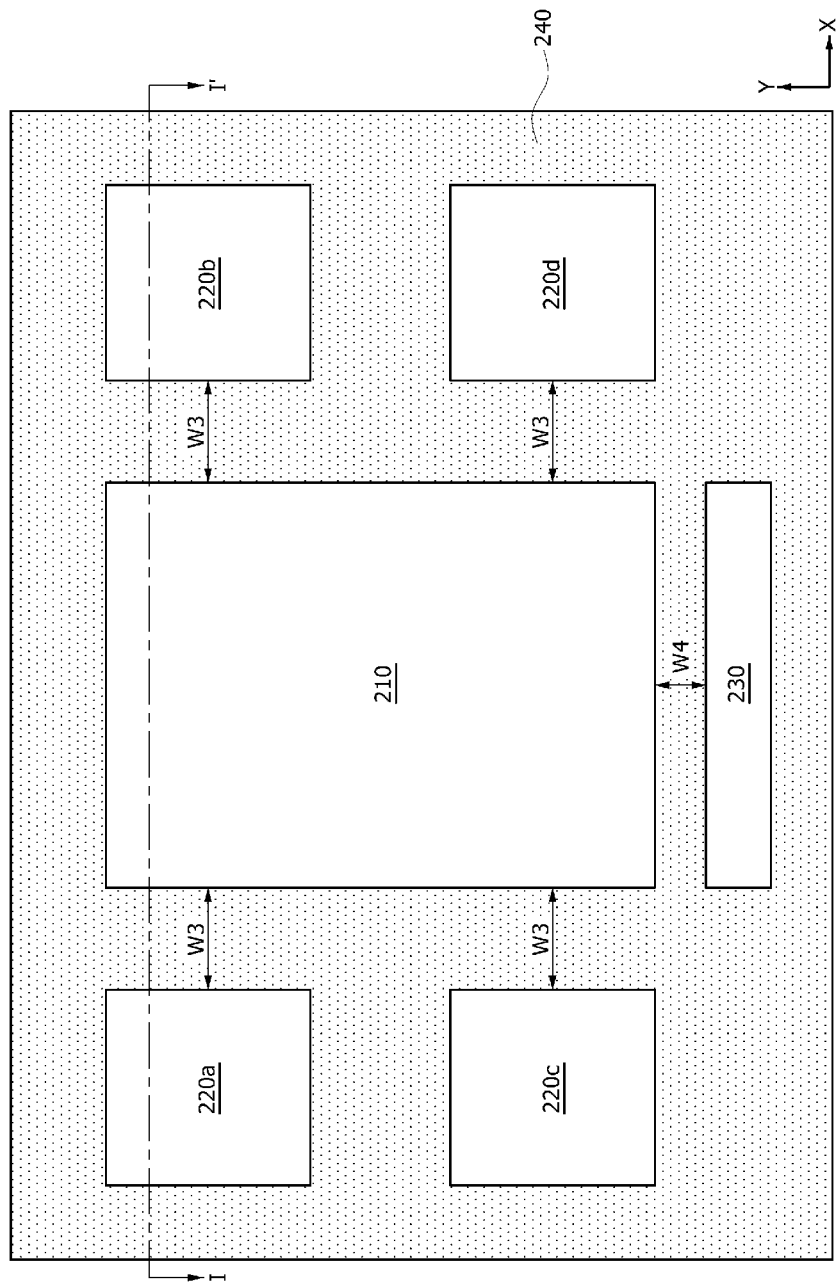
FIG. 6B is a block diagram representation of an embodiment of a molding part covering a plurality of semiconductor chips arranged on the interposer.

Referring to FIGS. 6A and 6B, an interposer 200 is provided. The interposer has a first surface 200a and a second surface 200b on the opposite side of the first surface 200a. A first semiconductor chip 210 and second semiconductor chips 220a, 220b, 220c, 220d are mounted on the interposer 200. The interposer 200 is formed of a semiconductor material including Si.

In an example, the first semiconductor chip 210 may be implemented as a single chip with a system IC including logic elements. Each of the second semiconductor chips 220a, 220b, 220c, 220d may have a structure where two or more semiconductor chips having high integration and high capacity characteristics, for example, memory semiconductor chips, are stacked. The second semiconductor chips 220a, 220b, 220c, 220d may be arranged at a first distance W3 from the first semiconductor chip 210 where the first semiconductor chip 210 is disposed in substantially the center of the interposer 100. In the areas around the first semiconductor chip 210 that do not include the second semiconductor chips 220a, 220b, 220c, 220d, a dummy chip 230 may be disposed at a predetermined second distance W4 from the first semiconductor chip 210. First connecting electrodes 215 are disposed between the first semiconductor chip 210 and the interposer 200 and electrically couple the first semiconductor chip 210 and the interposer 200. Second connecting electrodes 222 and 227 are disposed between the second semiconductor chips 220a, 220b, 220c, 220d and the interposer 200 and electrically couple the second semiconductor chips 220a, 220b, 220c, 220d and the interposer 200.

A molding part 240 may cover the exposed portions of the upper surface of the interposer 200, and exposed portions of the side and lower surfaces of first semiconductor chip 210, the second semiconductor chip 220a, 220b, 220c, 220d, and the dummy chip 230. The molding part 240 may not cover the upper surfaces of the first semiconductor chip 210, the second semiconductor chips 220a, 220b, 220c, 220d, and the dummy chip 230. The molding part 240 may fill the spaces between the first connecting electrodes 215 and the spaces between the second connecting electrodes 222, 227. The molding part 240 may include an insulating material such as EMC. The space between the first connecting electrodes and the space between the second connecting electrodes may be filled with an underfill material (not shown).

Figure 7:
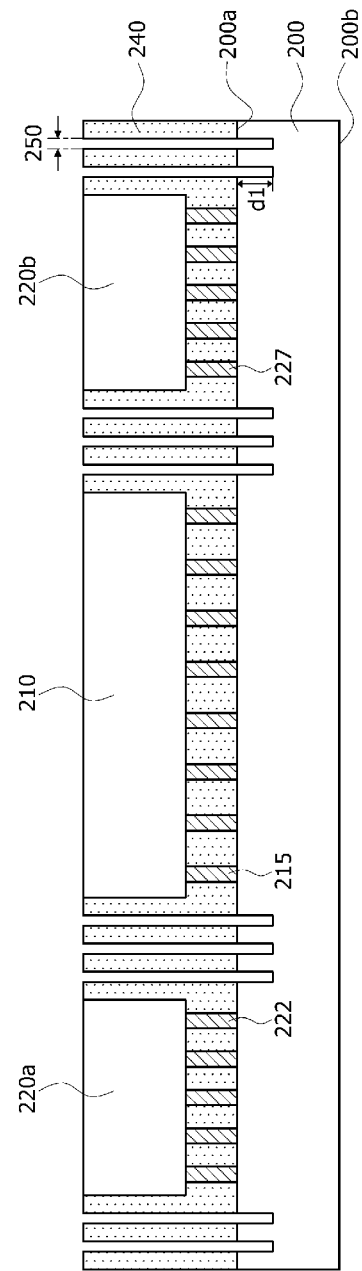
FIG. 7 is a block diagram representation of a cross-sectional view of an embodiment of trenches formed in the molding part covering the plurality of semiconductor chips arranged on the interposer.

Referring to FIG. 7, the molding part 240 is etched to form one or more trench holes 250. The trench holes 250 may be formed in the section of the molding part 240 disposed between the first semiconductor chip 210 and the second semiconductor chips 220a, 220b, 220c, 220d. The trench holes 250 may be formed in the section of the molding part 240 disposed between the second semiconductor chips 220a, 220b, 220c, 220d. The trench holes 250 may be formed in the section of the molding part 240 disposed around the edges of the second semiconductor chips 220a, 220b, 220c, 220d. The plurality of second semiconductor chips 220a, 220b, 220c, 220d may be arranged at a predetermined distance from each other in the molding part 240. The trench holes 250, for example, may extend a predetermined depth d1 from the first surface 200a of the interposer 200 into the interposer 200. The trench holes 250 may be formed through a sawing technique using laser or blade.

Figure 8:
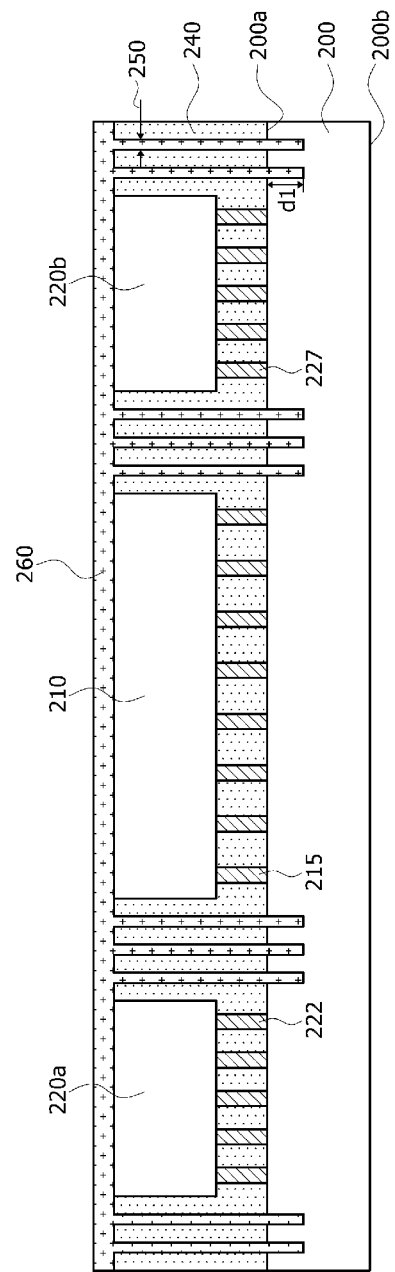
FIG. 8 is a block diagram representation of a cross-sectional view of an embodiment of thermal expansion buffer patterns formed to fill the trench holes formed in the molding part.

Referring to FIG. 8, a thermal expansion buffer layer 260 is formed over the interposer 200 and fills the trench holes 250. The thermal expansion buffer layer 260 may include a material having a high CTE or elasticity. The thermal expansion buffer layer 260 may, for example, be formed using one of insulating polymer materials such as BCB and polyimide or a mixture of one or more polymer materials. The thermal expansion buffer layer 260 may be formed to fill all of the trench holes 250 and extend a predefined depth d1 from the molding part 240 and the first surface 200a of the interposer 200 into the interposer 200.

Figure 9:
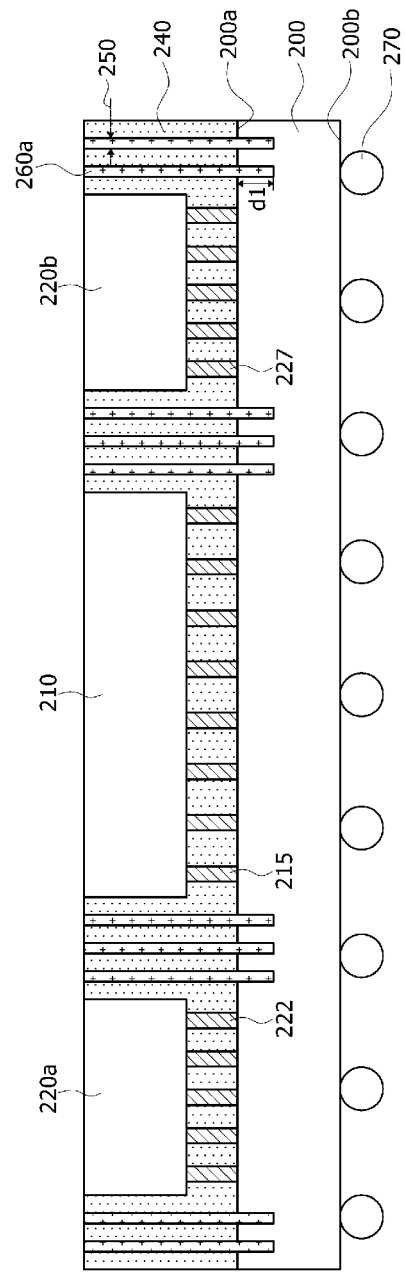
FIG. 9 is a block diagram representation of a cross-sectional view of an embodiment of thermal expansion buffer patterns formed to fill the trench holes formed in the molding part.

Referring to FIG. 9, a planarization process is performed on the thermal expansion buffer layer 260 so as to form thermal expansion buffer patterns 260a. The thermal expansion buffer patterns 260a may be formed using, for example, a CMP process. The planarization process may be performed until the upper surfaces of the first semiconductor chip 210, the second semiconductor chips 220a, 220b, 220c, 220d, and the dummy chip 230 are exposed. Then, the thermal expansion buffer patterns 260a are formed to fill the trench holes 250 that extend through the molding part 240 and into the interposer 200. Then, external connection terminals 270 may be formed on the second surface 205b of the interposer 200. Examples of the external connection terminals 270 may include, but are not limited to, solder balls, solder bumps or conductive bumps.

In semiconductor packages having the thermal expansion buffer patterns 260a formed in the molding part 240, stress applied to the interposer 200 may be offset as the thermal expansion buffer patterns 260a arranged in the molding part 240 contract or expand. The stress may be offset when the temperature of the interposer 200 is changed by a process such as a reflow process. It may be possible to reduce warping associated with the bending of the interposer 200. When the trench holes 250 extend to the predefined depth d1 from the first surface 200a of the interposer 200 into the interposer 200, the volume of the thermal expansion buffer patterns 260a used to fill the trench holes 250 may increase. As the volume that is contracting and expanding is increased, warpage may be reduced. When the trench holes 250 extend to the predefined depth d1 from the first surface 200a of the interposer 200 into the interposer 200, the areas where the thermal expansion buffer patterns 260a used to fill the trench holes 250 are in contact with the interposer 200 may increase. This increase may improve the reliability of the package.

Figure 10:
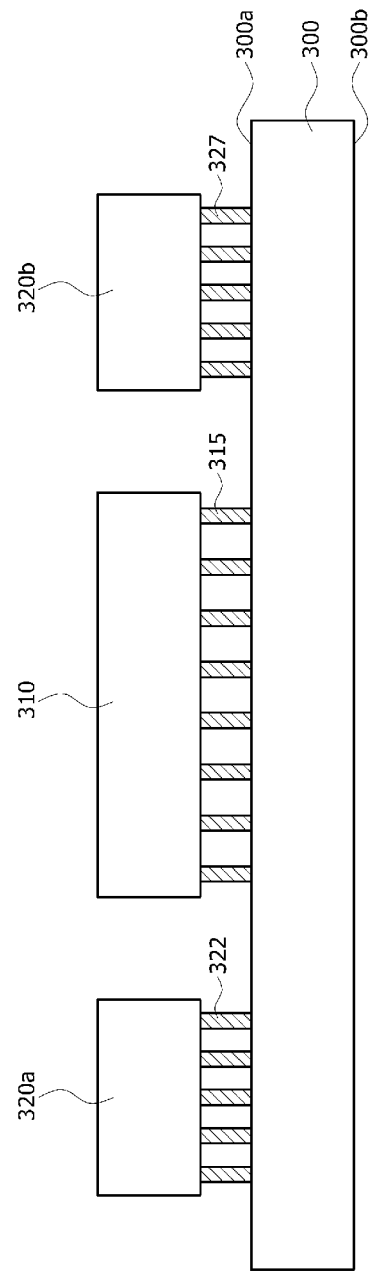
FIG. 10 is a block diagram representation of a cross-sectional view of an embodiment of an arrangement of a plurality of semiconductor chips on an interposer.
Figure 11:
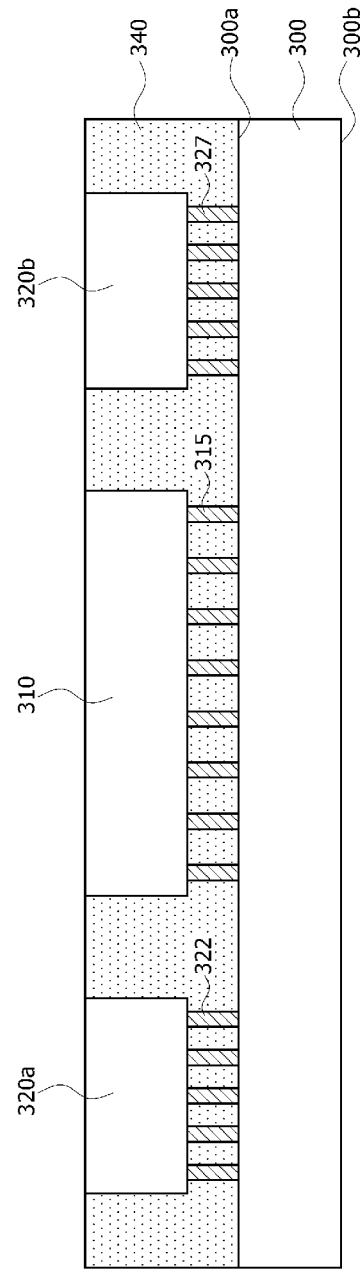
FIG. 11 is a block diagram representation of a cross-sectional view of an embodiment of a molding part covering the plurality of semiconductor chips arranged on the interposer.
Figure 12:
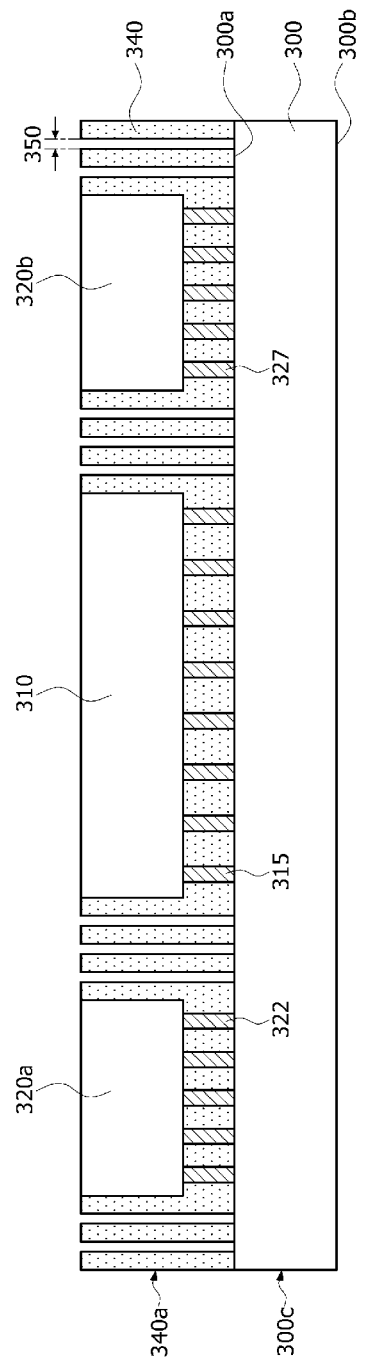
FIG. 12 is a block diagram representation of a cross-sectional view of an embodiment of trenches formed in the molding part covering the plurality of semiconductor chips arranged on the interposer.

FIGS. 10 to 12 are diagrams illustrating an embodiment of a method of manufacturing a semiconductor package.

Referring to FIG. 10, a plurality of semiconductor chips 310, 320a, 320b are arranged on a first surface 300a of an interposer 300 where the interposer 300 includes the first surface 300a and a second surface 300b on a side opposite the first surface 300a. The plurality of semiconductor chips 310, 320a, 320b arranged on the first surface 300a of the interposer 300 may include a first semiconductor chip 310 where the first semiconductor chip 310 is implement using an IC including logic elements and second semiconductor chips 320a and 320b where the second semiconductor chips are memory semiconductor chips. The first semiconductor chip 310 may be disposed in substantially the center of the interposer 300, and the second semiconductor chips 320a 320b may be disposed at a predefined distance from the first semiconductor chip 310. In an embodiment, the semiconductor package includes two second semiconductor chips 320a 320b. As illustrated in FIG. 1B, the two semiconductor chips may be disposed on either side of the first semiconductor chip, and the semiconductor package may include a dummy chip.

First connecting electrodes 315 may be disposed between the first semiconductor chip 310 and the interposer 300 and electrically couple the first semiconductor chip 310 and the interposer 300. Second connecting electrodes may be disposed between the second semiconductor chips 320a 320b and the interposer 300 and electrically couple the second semiconductor chips 320a 320b and the interposer 300.

Referring to FIG. 11, a molding part 340 is formed over the interposer 300 and covers exposed sides and lower surfaces of the interposer 300, the first semiconductor chip 310, and the second semiconductor chips 320a 320. The molding part 340 may be formed by applying an insulating material such as EMC. The molding part 340 is formed such that the upper surfaces of the first semiconductor chip 310 and the second semiconductor chips 320a 320b are exposed. The molding part 340 is formed to fill the spaces between the first connecting electrodes 315 and the spaces between the second connecting electrodes 322, 327.

Referring to FIG. 12, one or more trench holes 350 are formed in the molding part 340. The trench holes 350 may be arranged at a distance from each other in the molding part 340. The trench holes 350 may be formed in the section of the molding part 340 between the first semiconductor chip 310 and the second semiconductor chips 320a, 320b. As the trench holes 350 are formed in the sections of the molding part 340 around the first semiconductor chip 310 and the second semiconductor chips 320a, 320b, the heat generated from the first and second semiconductor chips 310, 320a, 320b may be dissipated and may improve the heat dissipation characteristics of the package.

The trench holes 350 may be formed in the sections of the molding part 340 disposed around the edges of the second semiconductor chips 320a, 320b. The outermost portion 340a of the molding part 340 having the trench holes 350 formed therein is positioned in line with an outer portion 300c of the interposer 300. External connection terminals may be formed on the second surface 305b of the interposer 300. The external connection terminals may for example include, but are not limited to, solder balls, solder bumps, and conductive bumps.

Semiconductor packages having the one or more trench holes 350 formed in the molding part 340 may have a structure where the molding part 340 is discontinuously arranged while the area occupied by the molding part 340 is reduced. The one or more trench holes 350 disposed in the molding part 340 may become stress release points such that stress applied to the molding part 140 may be released. As the number of trench holes 350 in the molding part 340 is increased, the amount of stress released may increase. The release of stress may reduce warping.

Figure 13:
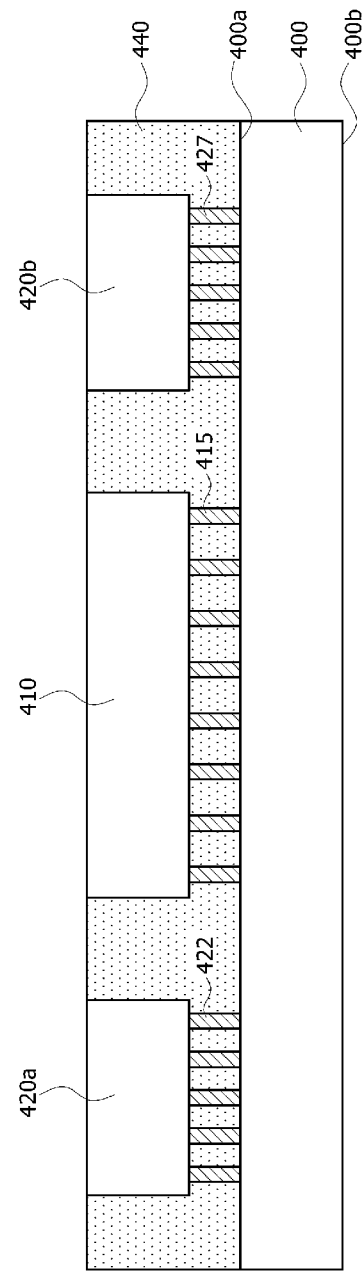
FIG. 13 is a block diagram representation of a cross-sectional view of an embodiment of a molding part covering the plurality of semiconductor chips arranged on the interposer.
Figure 14:
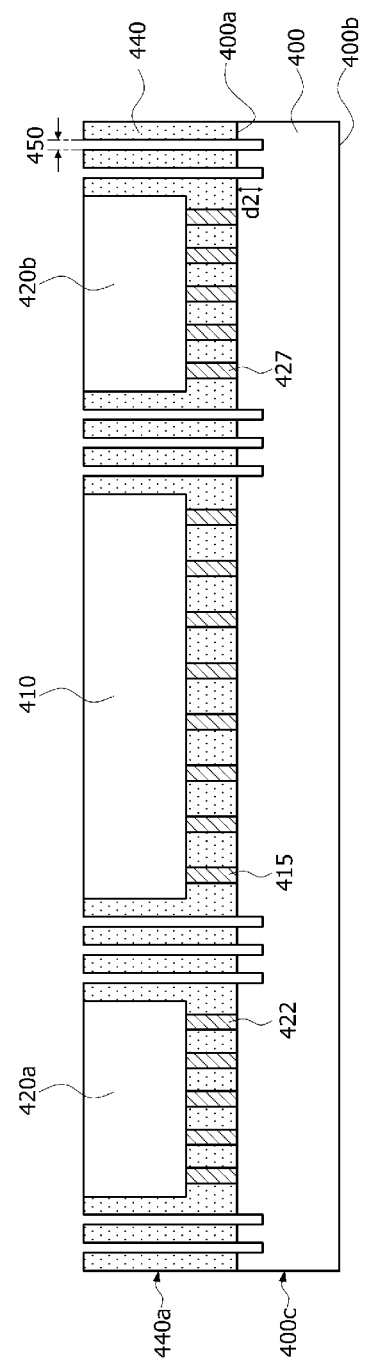
FIG. 14 is a block diagram representation of a cross-sectional view of an embodiment of trenches formed in the molding part covering the plurality of semiconductor chips arranged on the interposer.

FIGS. 13 and 14 are diagrams illustrating an embodiment of a method for manufacturing a semiconductor package.

Referring to FIG. 13, an interposer 400 is provided has a first surface 400a and a second surface 400b on a side opposite the first surface 400a. A plurality of semiconductor chips 410, 420a, 420b are arranged on the first surface 400a of the interposer 400. The interposer 400 may be formed of a semiconductor material including Si. The plurality of semiconductor chips 410, 420a, 420b arranged on the first surface 400a of the interposer 400 may include a first semiconductor chip 410 implemented with an IC including logic elements and second semiconductor chips 420a, 420b including memory semiconductor chips. The second semiconductor chips 420a, 420b may be arranged at a predefined distance from the first semiconductor chip 310 where the first semiconductor chip 310 is disposed in substantially the center of the interposer 400. First connecting electrodes 415 are disposed between the first semiconductor chip 410 and the interposer 400 and electrically couple the first semiconductor chip 410 and the interposer 400. Second connecting electrodes 422 are disposed between the second semiconductor chips 420a, 420b and the interposer 400 and electrically couple the second semiconductor chips 420a, 420b and the interposer 400.

The side and lower portions of the interposer 400, the first semiconductor chip 410, and the second semiconductor chips 420a, 420b are covered by a molding part 440. The molding part 440 may be formed such that the upper surfaces of the first semiconductor chip 410 and the second semiconductor chips 420a, 420b are exposed. The molding part 440 fills the spaces between the first connecting electrodes 415 and the spaces between the second connecting electrodes 422, 427. The molding part 440 may include an insulating material such as EMC.

Referring to FIG. 14, one or more trench holes 450 are formed in the molding part 440. The trench holes 450 may be formed through a sawing technique using a laser or blade. The trench holes 450 may be formed in the section of the molding part 440 disposed between the first semiconductor chip 410 and the second semiconductor chips 420a, 420b. The trench holes 450 may be formed in the section of the molding part 440 disposed around the edges of the second semiconductor chips 420a, 420b. The trench holes 450 may be arranged at a predefined distance from each other in the molding part 440. The trench holes 450 may, for example, extend a predefined distance d2 from the first surface 400a of the interposer 400 into the interposer 400. The outermost portion 440a of the section of the molding part 440 having the trench holes 450 formed therein is positioned in line with an outer portion 400c of the interposer 400.

In an embodiment of the semiconductor package where the trench holes 450 in the molding part 440 extend the predefined depth d2 from the first surface 400a of the interposer 400 into the interposer 400, the volume of the interposer 400 may be reduced. As the volume of the interposer 400 is reduced, the elastic modulus of the interposer 400 including Si may be reduced to reduce warping.

The packages described above may be applied to various electronic systems.

Figure 15:
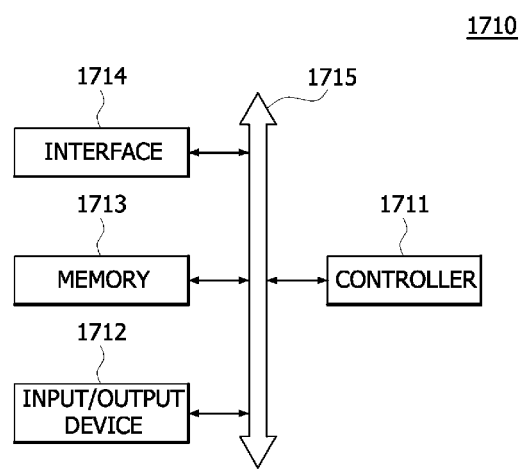
FIG. 15 is a block diagram illustrating an electronic system including a package according to an embodiment.

Referring to FIG. 15, the package in accordance with an embodiment may be applied to an electronic system 1710. The electronic system 1710 may include a controller 1711, an input/output unit 1712, and a memory 1713. The controller 1711, the input/output unit 1712, and the memory 1713 may be coupled with one another through a bus 1715 providing a path through which data are transmitted.

For example, the controller 1711 may include at least any one of at least one microprocessor, at least one digital signal processor, at least one microcontroller, and logic devices capable of performing the same functions as these components. At least one of the controller 1711 and the memory 1713 may include at least any one of the packages according to the embodiments of the present disclosure. The input/output unit 1712 may include at least one selected among a keypad, a keyboard, a display device, a touch screen and so forth. The memory 1713 is a device for storing data. The memory 1713 may store data and/or commands to be executed by the controller 1711, and the like.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 1710 may stably store a large amount of data in a flash memory system.

The electronic system 1710 may further include an interface 1714 suitable for transmitting and receiving data to and from a communication network. The interface 1714 may be a wired or wireless type. For example, the interface 1714 may include an antenna or a wired or wireless transceiver.

The electronic system 1710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

In an embodiment wherein the electronic system 1710 is an equipment capable of performing wireless communication, the electronic system 1710 may be used in a communication system such as a system employing one or more of CDMA (code division multiple access), GSM (global system for mobile communications), NADC (North American digital cellular), E-TDMA (enhanced-time division multiple access), WCDMA (wideband code division multiple access), CDMA2000, LTE (long term evolution), and Wibro (wireless broadband Internet).

Figure 16:
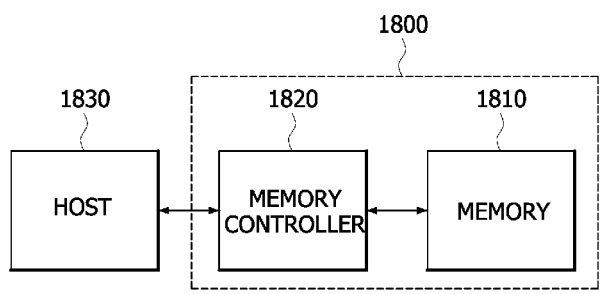
FIG. 16 is a block diagram illustrating another electronic system including a package according to an embodiment.

Referring to FIG. 16, the package in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technologies of the embodiments of the present disclosure are applied. The memory controller 1820 may control the memory 1810 such that stored data is read out or data is stored in response to a read/write request from a host 1830.

While certain embodiments have been described above, it will be understood to those skilled in the art that the embodiments described are by way of example only. Accordingly, the semiconductor system described herein should not be limited based on the described embodiments. Rather, the semiconductor system described herein should only be limited in light of the claims that follow when taken in conjunction with the above description and accompanying drawings.

What is claimed is:

1. A semiconductor package comprising:
   an interposer having a first surface and a second surface that oppose each other;
   a first semiconductor chip disposed on the first surface of the interposer and at least one second semiconductor chip disposed on the first surface and at a predefined distance from the first semiconductor chip;
   a molding part filling spaces between the first semiconductor chip and the at least one second semiconductor chip and having a plurality of trench holes formed therein, wherein the trench holes comprise a plurality of first trench holes and a plurality of second trench holes, the plurality of first trench holes extend in a substantially horizontal direction with respect to the first surface of the interposer and the second trench holes extend in a substantially vertical direction with respect to the first surface of the interposer wherein the plurality of second trench holes cross the first trench holes; and
   a thermal expansion buffer pattern filling the trench holes, wherein the thermal expansion buffer pattern contracts or expands when the temperature of the interposer is changed, thereby the stress applied to the molding part is released.

2. The semiconductor package of claim 1, further comprising a plurality of first connecting electrodes disposed between the first semiconductor chip and the interposer and a plurality of second connecting electrodes disposed between the at least one second semiconductor chip and the interposer.

3. The semiconductor package of claim 1, wherein the first semiconductor chip comprises a system integrated circuit (IC), and the at least one second semiconductor chip comprises a memory semiconductor chip.

4. The semiconductor package of claim 1, wherein the first semiconductor chip is disposed in substantially the center of the interposer, and at least two second semiconductor chips are disposed on either side of the first semiconductor chip and face each other.

5. The semiconductor package of claim 1, wherein the interposer comprises silicon.

6. The semiconductor package of claim 1, wherein the molding part comprises epoxy molding compound (EMC).

7. The semiconductor package of claim 1, wherein the trench holes are formed to expose the first surface of the interposer.

8. The semiconductor package of claim 1, wherein the trench holes penetrate the molding part and extend a predefined depth from the first surface of the interposer toward the second surface of the interposer.

9. The semiconductor package of claim 1, wherein the thermal expansion buffer pattern is formed from a material selected from a group consisting of polymer materials including BCB (Benzocyclobutene) and polyimide or a mixture of one more polymer materials.

10. A semiconductor package comprising:
    an interposer having a first surface and a second surface that oppose each other;

a first semiconductor chip disposed on the first surface of the interposer and a plurality of second semiconductor chips disposed at a predefined distance from the first semiconductor chip;

a molding part filling spaces between the first semiconductor chip and the second semiconductor chips and having an outer portion positioned substantially in line with an outer portion of the interposer; and a plurality of trench holes formed in each one of the spaces filled with the molding part, wherein the trench holes penetrate the molding part and extend a predefined depth from the first surface of the interposer toward the second surface of the interposer.

11. The semiconductor package of claim 10, wherein the first semiconductor chip comprises a system on chip (SOC), and the second semiconductor chips comprise memory semiconductor chips.

12. The semiconductor package of claim 10, wherein the first semiconductor chip is disposed in substantially the center of the interposer, and the second semiconductor chips are disposed on either side directions of the first semiconductor chips, and face each other.

13. The semiconductor package of claim 10, wherein the interposer comprises silicon, and the molding part comprises EMC.

14. The semiconductor package of claim 1, wherein the semiconductor package is included in an electronic system, the electronic system further comprising;

a memory; and a controller coupled to the memory through a bus, wherein the memory or the controller includes the package.

15. The semiconductor package of claim 1, wherein the semiconductor package is included in a memory card, the memory card further comprising;

a memory; and a controller coupled to the memory through a bus, wherein the memory or the controller includes the package.

16. The semiconductor package of claim 10, wherein the semiconductor package is included in an electronic system, the electronic system further comprising;

a memory; and a controller coupled to the memory through a bus, wherein the memory or the controller includes the package.

17. The semiconductor package of claim 10, wherein the semiconductor package is included in a memory card, the memory card further comprising;

a memory; and a controller coupled to the memory through a bus, wherein the memory or the controller includes the package.

* * * * *